(12) United States Patent
Masuda et al.

(10) Patent No.: US 10,393,125 B2
(45) Date of Patent: Aug. 27, 2019

(54) COOLING SYSTEM FOR VEHICLE-MOUNTED POWER CONTROL DEVICE AND METHOD FOR DIAGNOSING ABNORMALITY IN COOLING SYSTEM

(71) Applicant: HINO MOTORS, LTD., Tokyo (JP)

(72) Inventors: Manabu Masuda, Hino (JP); Takayuki Suruga, Hino (JP); Shin Mizoroki, Hino (JP)

(73) Assignee: HINO MOTORS, LTD., Tokyo (JP)

( * ) Notice: Subject to any disclaimer, the term of this patent is extended or adjusted under 35 U.S.C. 154(b) by 769 days.

(21) Appl. No.: 14/433,946

(22) PCT Filed: Oct. 10, 2013

(86) PCT No.: PCT/JP2013/077619
§ 371 (c)(1),
(2) Date: Apr. 7, 2015

(87) PCT Pub. No.: WO2014/058021
PCT Pub. Date: Apr. 17, 2014

(65) Prior Publication Data
US 2015/0267708 A1 Sep. 24, 2015

(30) Foreign Application Priority Data
Oct. 12, 2012 (JP) .................................. 2012-226846

(51) Int. Cl.
*F04D 25/06* (2006.01)
*F04D 13/06* (2006.01)
(Continued)

(52) U.S. Cl.
CPC .............. *F04D 25/06* (2013.01); *B60L 1/003* (2013.01); *B60L 58/26* (2019.02); *F04D 13/06* (2013.01);
(Continued)

(58) Field of Classification Search
CPC . F01P 9/00; F01P 9/04; F04D 15/0077; F04D 15/0236; F04D 25/0673;
(Continued)

(56) References Cited

U.S. PATENT DOCUMENTS 6,293,838 B1 * 9/2001 Ferguson ................ B63B 35/26
440/1
2004/0247449 A1 * 12/2004 Ma ........................ F04D 27/004
318/400.01
(Continued)

FOREIGN PATENT DOCUMENTS

JP    5-95650 A    4/1993
JP    7-310919 A   11/1995
(Continued)

OTHER PUBLICATIONS

International Search Report prepared by the Japanese Patent Office dated Dec. 12, 2013, for International Application No. PCT/JP2013/077619.
(Continued)

*Primary Examiner* — Bryan M Lettman
*Assistant Examiner* — Timothy P Solak
(74) *Attorney, Agent, or Firm* — Sheridan Ross PC (57) ABSTRACT

A cooling system includes a cooling device and an electronic control device for controlling the cooling device. The cooling device has a rotating component for delivering cooling medium and a drive source for controlling the rotating component. The electronic control device stores diagnosis reference information, which indicates an actual rotation speed acceptable range when an actual rotation speed of the drive source is apart from an instructed rotation speed of the drive source. The actual rotation speed acceptable range is an acceptable range of the actual rotation speed. The acceptable range changes according to the instructed rotation speed (Continued)

and a voltage value applied to the drive source. The electronic control device obtains the acceptable range based on the diagnosis reference information to determine whether the cooling device is in a normal state.

7 Claims, 4 Drawing Sheets (51) Int. Cl.
*F04D 15/02* (2006.01)
*F04D 15/00* (2006.01)
*F04D 27/00* (2006.01)
*F04D 29/58* (2006.01)
*B60L 1/00* (2006.01)
*B60L 58/26* (2019.01)
*B60K 6/485* (2007.10)
*B60K 11/02* (2006.01)
*B60K 11/06* (2006.01)
*B60K 1/00* (2006.01)
*B60L 3/00* (2019.01)
*B60L 7/14* (2006.01)
*F01P 5/14* (2006.01)
*F01P 7/02* (2006.01)
*F01P 7/04* (2006.01)
*H05K 7/20* (2006.01)
*B60L 50/40* (2019.01)
*B60L 50/16* (2019.01)

(52) U.S. Cl.
CPC ..... *F04D 15/0066* (2013.01); *F04D 15/0077* (2013.01); *F04D 15/0236* (2013.01); *F04D 27/008* (2013.01); *F04D 29/58* (2013.01); *B60K 6/485* (2013.01); *B60K 11/02* (2013.01); *B60K 11/06* (2013.01); *B60K 2001/003* (2013.01); *B60L 3/00* (2013.01); *B60L 3/0084* (2013.01); *B60L 7/14* (2013.01); *B60L 50/16* (2019.02); *B60L 50/40* (2019.02); *B60L 2240/36* (2013.01); *B60L 2240/421* (2013.01); *B60L 2240/427* (2013.01); *B60L 2240/525* (2013.01); *B60L 2240/545* (2013.01); *F01P 5/14* (2013.01); *F01P 7/02* (2013.01); *F01P 7/04* (2013.01); *F01P 2031/36* (2013.01); *F01P 2050/24* (2013.01); *F04B 2203/0209* (2013.01); *F04B 2207/70* (2013.01); *H05K 7/20927* (2013.01); *H05K 7/20945* (2013.01); *Y02T 10/6226* (2013.01); *Y02T 10/642* (2013.01); *Y02T 10/70* (2013.01); *Y02T 10/7005* (2013.01); *Y02T 10/705* (2013.01); *Y02T 10/7022* (2013.01); *Y02T 10/7077* (2013.01)

(58) Field of Classification Search
CPC .... F04D 27/006; F04D 29/58; F04D 29/5813; F04D 29/5866; F04B 2201/1202; F04B 2207/70
See application file for complete search history.

(56) References Cited

U.S. PATENT DOCUMENTS

| | | | |
|---|---|---|---|
| 2005/0257546 A1* | 11/2005 | Ishishita | B60L 3/0023 62/236 |
| 2006/0202652 A1* | 9/2006 | Amagasa | H02P 7/2913 318/434 |
| 2008/0060589 A1* | 3/2008 | Carney | B60K 11/02 123/41.31 |
| 2009/0024252 A1* | 1/2009 | Aridome | B60K 6/445 700/275 |
| 2010/0100266 A1* | 4/2010 | Yoshinori | B60K 1/04 701/22 |
| 2010/0155162 A1* | 6/2010 | Nakamura | B60L 11/187 180/65.29 |
| 2010/0300646 A1 | 12/2010 | Sawaguchi et al. | |
| 2013/0030643 A1 | 1/2013 | Nishizawa | |

FOREIGN PATENT DOCUMENTS

| | | |
|---|---|---|
| JP | 2008-256313 | 10/2008 |
| JP | 2009-171702 | 7/2009 |
| JP | 2010-3506 A | 1/2010 |
| JP | 2011-89480 A | 5/2011 |
| JP | 2011-132853 A | 7/2011 |
| WO | WO 2005/121521 | 12/2005 |
| WO | WO 2012-120592 A1 | 9/2012 |

OTHER PUBLICATIONS

International Preliminary Report on Patentability (English translation) for International Application No. PCT/JP2013/077619, dated Apr. 14, 2015, 6 pages.

Extended Search Report for European Patent Application No. 13846181.9, dated Jul. 8, 2016, 9 pages.

* cited by examiner

Fig.6

COOLING SYSTEM FOR VEHICLE-MOUNTED POWER CONTROL DEVICE AND METHOD FOR DIAGNOSING ABNORMALITY IN COOLING SYSTEM

CROSS REFERENCE TO RELATED APPLICATIONS

This application is a national stage application under 35 U.S.C. 371 and claims priority to and the benefit of PCT Application No. PCT/JP2013/077619 having an international filing date of Oct. 10, 2013, which designated the United States, which PCT application claimed priority to and the benefit of Japanese Patent Application No. 2012-226846 filed on Oct. 12, 2012, the disclosures of each of which are incorporated herein by reference.

FIELD OF THE INVENTION

The techniques of the present disclosure relate to a cooling system for a power control unit that is installed in a hybrid vehicle or an electric vehicle and to a method for diagnosing an abnormality in the cooling system.

BACKGROUND OF THE INVENTION

A power control unit installed in a vehicle such as a hybrid vehicle includes a battery module and an inverter. The inverter in general includes a high-power semiconductor element to increase the output. Such an inverter generates a large amount of heat due to power loss. For this reason, the power control unit is provided with an independent cooling system.

One example of cooling systems for a power control unit adopts both water-cooling and air-cooling types. The water cooling device cools an inverter of the power control unit. The water cooling device includes a circulation path, through which liquid cooling medium circulates, an electric pump for circulating the cooling medium, and a radiator for cooling the cooling medium. An electric fan for accelerating radiation of heat is arranged on a lateral surface of the radiator. The air cooling device cools a battery module including a plurality of cells. The air cooling device includes an electric fan for delivering air between the cells.

The occurrence of an abnormality in the cooling system complicates maintaining the inverter and the battery module at a temperature in an adequate temperature range. For example, if an abnormality occurs in an electric pump and an electric fan for the inverter, the temperature of cooling medium may exceed an upper limit to cause unfavorable effect on the semiconductor element. If an abnormality occurs in an electric fan for the battery module, increase in the temperature may greatly change the battery characteristics. Thus, prompt detection of an abnormality in the cooling system is necessary for the power control unit to function normally.

PRIOR ART DOCUMENT

Patent Document

Patent Document 1: Japanese Laid-Open Patent Publication No. 5-95650

A method is known that detects an abnormality in an electric fan and the like based on a detected rotation speed. For example, Patent Document 1 discloses an abnormality detection system that includes a detection device for detecting the rotation speed of a fan, a counter for measuring a rotation pulse, and a rotation speed setting unit for setting a reference rotation speed for the fan. The abnormality detection system further includes a comparator for comparing the reference rotation speed with the measured result of the counter. The comparator determines normal or abnormal according to the amount of the difference between the reference rotation speed and the measured result.

SUMMARY OF THE INVENTION

In a hybrid vehicle, for example, the input voltage to components of the cooling system such as a fan and a pump greatly changes, e.g., when the vehicle at idling starts moving, as compared with a vehicle including only an internal combustion engine (hereinafter, an engine). Thus, the difference between an instructed rotation speed and an actual rotation speed may increase although the fan and the pump are normal. As a result, when being installed in a vehicle-mounted power control unit, the abnormality detection system may mistakenly determine that an abnormality has occurred in the fan and the pump although the fan and the pump are normal. Thus, it is difficult in a hybrid vehicle or an electric vehicle to detect an abnormality in components of the cooling system, such as a fan and a pump, as compared with a vehicle having only an engine installed. Not only cooling systems configured as above but also most of cooling systems for a vehicle-mounted power control unit have such a problem in common.

An objective of the present disclosure is to provide a cooling system for a vehicle-mounted power control unit and a method for diagnosing an abnormality in the cooling system that reduce diagnostic errors.

According to one aspect, a cooling system comprises a cooling device for cooling a power control unit of a vehicle and an electronic control device for controlling the cooling device. The cooling device includes a rotating component for delivering cooling medium and a drive source for controlling the rotating component. The electronic control device is adapted to store drive source diagnosis reference information that indicates an actual rotation speed acceptable range when an actual rotation speed of the drive source is apart from an instructed rotation speed of the drive source, wherein the actual rotation speed acceptable range is an acceptable range of the actual rotation speed. The acceptable range changes according to the instructed rotation speed and a voltage value applied to the drive source. The electronic control device is further adapted to obtain the acceptable range of the actual rotation speed from the voltage value applied to the drive source and the instructed rotation speed based on the drive source diagnosis reference information, when the actual rotation speed of the drive source is included in the obtained acceptable range, determine that the cooling device is in a normal state, and when the actual rotation speed is not included in the acceptable range, determine that the cooling device is in an abnormal state.

In the above aspect, when abnormality diagnosis is executed in the cooling device, the acceptable range of the actual rotation speed is obtained according to the diagnosis reference information, the actual instructed rotation speed, and the voltage value applied to the drive source. The diagnosis reference information is associated with the instructed rotation speed of the drive source and the voltage value of the drive source. In this way, even if the input voltage to the drive source greatly changes, e.g., when the vehicle at idling starts moving, the acceptable range of the actual rotation speed changes according to the voltage value.

This reduces diagnostic errors, such as an erroneous diagnosis of an abnormality occurrence in the rotating component and the drive source when the rotating component and the drive source are normal.

According to one embodiment, the power control unit includes an inverter connected to a rotating electrical machine and a battery connected to the inverter. The rotating component is an electric fan that delivers air into the battery to cool the battery. The electronic control device is adapted to output an instructed fan rotation speed, which is an instructed rotation speed of the electric fan, to the electric fan according to a temperature inside the battery and store fan diagnosis reference information that indicates a fan rotation speed acceptable range when an actual fan rotation speed is apart from the instructed fan rotation speed. The fan rotation speed acceptable range is an acceptable range of the actual fan rotation speed, which is an actual rotation speed of a drive source of the electric fan. The fan rotation speed acceptable range changes according to the instructed fan rotation speed and a voltage value applied to the electric fan. The electronic control device is further adapted to obtain the fan rotation speed acceptable range from the voltage value applied to the electric fan and the instructed fan rotation speed based on the fan diagnosis reference information, when the actual fan rotation speed is included in the obtained fan rotation speed acceptable range, determine that the electric fan is in a normal state, and when the actual fan rotation speed is not included in the fan rotation speed acceptable range, determine that the electric fan is in an abnormal state.

In the above embodiment, when abnormality diagnosis is executed in the electric fan, the acceptable range of the actual rotation speed for the instructed rotation speed is obtained according to the voltage value applied to the drive source. In this way, even if the input voltage to the drive source of the electric fan greatly changes, e.g., when the vehicle at idling starts moving, the acceptable range of the actual rotation speed changes according to the voltage value. This reduces diagnostic errors, such as an erroneous diagnosis of an abnormality occurrence in the electric fan when the electric fan is normal.

According to another embodiment, the power control unit includes an inverter connected to a rotating electrical machine and a battery connected to the inverter. The cooling device further includes a cooling medium circulation flow path, through which cooling medium circulates, and a radiator for cooling the cooling medium. The cooling medium cools at least the inverter. The rotating component is a pump that delivers the cooling medium. The electronic control device is adapted to output an instructed pump rotation speed, which is an instructed rotation speed of a drive source of the pump, to the pump according to a temperature of the cooling medium and store a pump rotation speed acceptable range that is an actual pump rotation speed acceptable range when an actual pump rotation speed is apart from the instructed pump rotation speed. The actual pump rotation speed acceptable range is an acceptable range of the actual pump rotation speed, which is an actual rotation speed of the drive source of the pump. The pump rotation speed acceptable range changes according to a voltage value applied to the drive source. The electronic control device is further adapted to obtain the pump rotation speed acceptable range based on the voltage value applied to the drive source and the instructed pump rotation speed, when the actual pump rotation speed is included in the obtained pump rotation speed acceptable range, determine that the pump is in a normal state, and when the actual pump rotation speed is not included in the pump rotation speed acceptable range, determine that the pump is in an abnormal state.

In the above embodiment, when abnormality diagnosis is executed in the pump, the acceptable range of the actual rotation speed for the instructed rotation speed is obtained according to the voltage value applied to the drive source. In this way, even if the input voltage to the drive source of the pump greatly changes, e.g., when the vehicle at idling starts moving, the acceptable range of the actual rotation speed changes according to the voltage value. This reduces diagnostic errors, such as an erroneous diagnosis of an abnormality occurrence in the pump when the pump is normal.

According to another embodiment, the power control unit includes an inverter connected to a rotating electrical machine and a battery connected to the inverter. The cooling device further includes a cooling medium circulation path, through which cooling medium circulates, and a radiator for cooling the cooling medium. The cooling medium cools at least the inverter. The rotating component is an electric fan that delivers air to cool the radiator. The electronic control device is adapted to output an instructed fan rotation speed, which is an instructed rotation speed of the electric fan, to the electric fan according to a temperature of the cooling medium and store fan diagnosis reference information that indicates a fan rotation speed acceptable range when an actual fan rotation speed is apart from the instructed fan rotation speed. The fan rotation speed acceptable range is an acceptable range of the actual fan rotation speed, which is an actual rotation speed of a drive source of the electric fan. The fan rotation speed acceptable range changes according to a voltage value applied to the drive source. The electronic control device is further adapted to obtain the fan rotation speed acceptable range based on the voltage value applied to the drive source and the instructed fan rotation speed, when the actual fan rotation speed is included in the obtained fan rotation speed acceptable range, determine that the electric fan is in a normal state, and when the actual fan rotation speed is not included in the fan rotation speed acceptable range, determine that the electric fan is in an abnormal state.

In the above embodiment, when abnormality diagnosis is executed in the electric fan, the acceptable range of the actual rotation speed for the instructed rotation speed is obtained according to the voltage value applied to the drive source. In this way, even if the input voltage to the drive source of the electric fan greatly changes, e.g., when the vehicle at idling starts moving, the acceptable range of the actual rotation speed changes according to the voltage value. This reduces diagnostic errors, such as an erroneous diagnosis of an abnormality occurrence in the electric fan when the electric fan is normal.

According to another aspect, a method for diagnosing an abnormality in a cooling device for cooling a power control unit of a vehicle is provided. The cooling device includes a rotating component for delivering cooling medium and a drive source for controlling the rotating component. The method comprises setting and storing drive source diagnosis reference information in advance. The drive source diagnosis reference information indicates an actual rotation speed acceptable range when an actual rotation speed of the drive source is apart from an instructed rotation speed of the drive source. The actual rotation speed acceptable range is an acceptable range of the actual rotation speed. The acceptable range changes according to the instructed rotation speed and a voltage value applied to the drive source. The method further comprises obtaining the acceptable range of the actual rotation speed from the voltage value applied to the drive source and the instructed rotation speed based on the drive source diagnosis reference information, when the actual rotation speed of the drive source is included in the obtained acceptable range, determining that the cooling device is in a normal state, and when the actual rotation speed is not included in the acceptable range, determining that the cooling device is in an abnormal state.

In this aspect, when abnormality diagnosis is executed in the cooling device, the acceptable range of the actual rotation speed is obtained according to the diagnosis reference information, the actual instructed rotation speed, and the voltage value applied to the drive source. The diagnosis reference information is associated with the instructed rotation speed and the voltage value of the drive source. In this way, even if the input voltage to the drive source greatly changes, e.g., when the vehicle at idling starts moving, the acceptable range of the actual rotation speed changes according to the voltage value. This reduces diagnostic errors, such as an erroneous diagnosis of an abnormality occurrence in the rotating component and the drive source when the rotating component and the drive source are normal.

DETAILED DESCRIPTION OF THE PREFERRED EMBODIMENTS

A cooling system for a vehicle-mounted power control unit and a method for diagnosing an abnormality in the cooling system according to one embodiment will now be described with reference to FIGS. 1 to 6.

Figure 1:
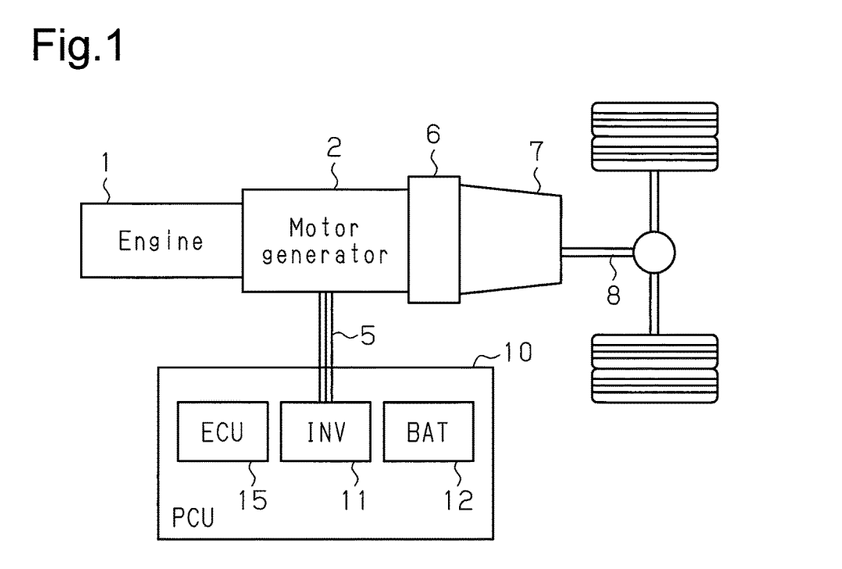
FIG. 1 is a block diagram of an example of a hybrid vehicle in which a vehicle-mounted cooling system according to the present disclosure is installed.

The cooling system according to the present embodiment is installed in a hybrid vehicle. As shown in FIG. 1, the hybrid vehicle includes an engine 1 and a motor generator 2. The motor generator 2 is coupled to the engine 1 via a gear mechanism (not shown). The motor generator 2 is connected to a power control unit (PCU) 10 with a three-phase cable 5. The motor generator 2 is also coupled to a transmission 7 via a clutch 6. The output shaft of the transmission 7 is coupled to a drive shaft 8 of the vehicle.

The PCU 10 includes an inverter 11 for a hybrid vehicle, a battery module 12 including a plurality of cells, and an ECU 15 as an electronic control system. The inverter 11 is connected to the motor generator 2 with the three-phase cable 5. The battery module 12 is electrically connected to the motor generator 2 via the inverter 11. The battery module 12 includes a rechargeable battery or a high capacity capacitor.

The inverter 11 includes a power semiconductor element and a cold plate that supports the element by sandwiching. After a boost convertor (not shown) boosts direct current of the battery module 12, the inverter 11 converts the direct current to three-phase alternating current and supplies the three-phase alternating current to the motor generator 2. The inverter 11 also converts three-phase alternating current generated by the motor generator 2 to direct current and supplies the direct current to the battery module 12. The direct current charges the battery module 12. The inverter 11 is controlled by the ECU 15, which is a component of the PCU 10.

For example, when the vehicle starts moving or is traveling with a low load, the battery module 12 supplies direct current to the inverter 11. The inverter 11 converts the supplied direct current to three-phase alternating current and supplies the three-phase alternating current to the motor generator 2. The motor generator 2 operates as a motor and transmits a rotation force to the drive shaft 8 via the clutch 6 and the transmission 7. When the inverter 11 and the battery module 12 are driven, some of electric energy supplied to the inverter 11 and the battery module 12 is released as heat.

For example, when the vehicle travels with a heavy load, a parallel traveling mode, in which the engine 1 and the motor generator 2 operate, is selected. When the remaining capacity of the battery module 12 becomes low, a regeneration mode is selected. These modes also drive the inverter 11 and the battery module 12 so that some of the electric energy is released as heat.

Figure 2:
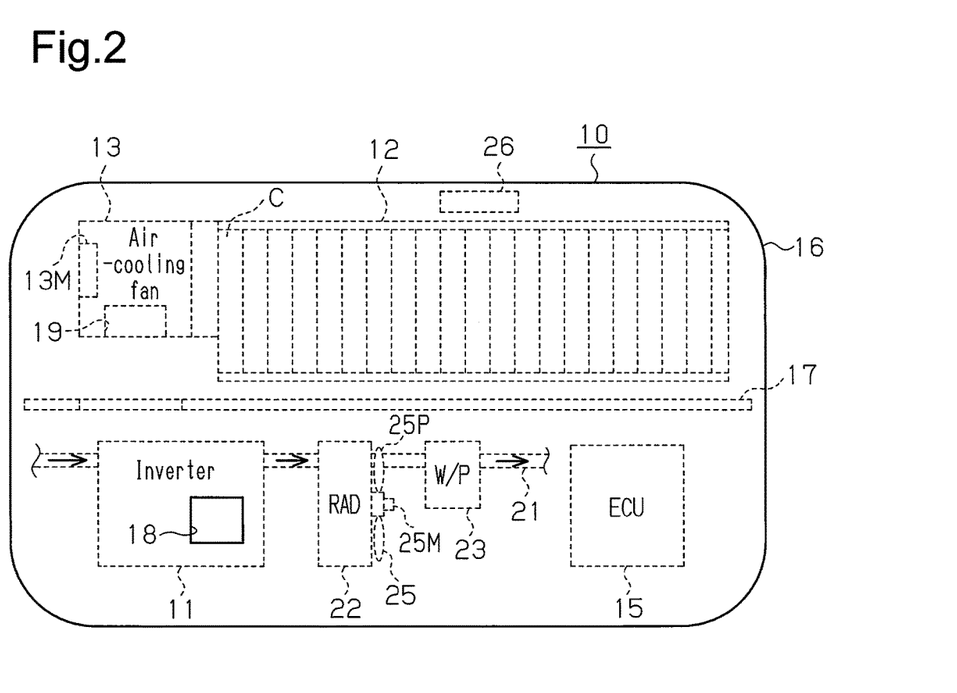
FIG. 2 is a block diagram showing the structure of a power control unit according to one embodiment of the vehicle-mounted cooling system of FIG. 1.

The structure of the PCU 10 will now be described. As shown in FIG. 2, the PCU 10 includes a case 16. The case 16 is partitioned into an upper part and a lower part with a partition board 17. The battery module 12 and an electric fan 13 as a cooling device for mainly cooling the battery module 12 are arranged in the upper part. The inverter 11, the ECU 15, and a water cooling system for cooling the inverter 11 and the ECU 15 are arranged in the lower part. The PCU 10 is attached to, e.g., a frame of a vehicle if the hybrid vehicle is a truck.

The electric fan 13 as a cooling device will first be described. The electric fan 13 includes, e.g., a blade portion as a rotating component, a housing for directing the airflow in a direction by generating swirling flow, and a drive motor 13M as a drive source for rotating the blade portion. A regular electric power supply of the vehicle supplies electric power to the drive motor 13M.

The case 16 includes a wall portion surrounding the space of the lower part. The wall portion includes an air introduction port 18, through which air is drawn into the case 16. The case 16 includes another wall portion surrounding the space of the upper part. The wall portion includes an air introduction port 19, through which air is drawn into the case 16.

The air drawn into the case 16 flows into a gap between the battery module 12 and the partition board 17 when the electric fan 13 is driven. The air flows into between cells C included in the battery module 12 through the gap. The air contacts lateral surfaces of the cells C to cool the cells C. The air that has passed between the cells C is discharged to the outside through an air discharge port 26.

The cooling system in the lower part includes a circulation path 21, through which liquid cooling medium circulates, a radiator 22 arranged in a portion of the circulation path 21, and a water pump 23 as a cooling device. The water pump 23 includes, e.g., an impeller as a rotating component, a housing accommodating the impeller, and a drive motor 23M as a drive source for rotating the impeller.

A flow path is arranged inside the cold plate of the inverter 11. The circulation path 21 communicates with the flow path. The cooling medium passes through the flow path arranged in the cold plate to absorb heat released from the semiconductor element. When the water pump 23 is driven, the cooling medium flows to the inverter 11 and the radiator 22 in this order to circulate in the circulation path 21.

An electric fan 25 as a cooling device is arranged on a lateral surface of the radiator 22. The electric fan 25 includes, e.g., a propeller 25P as a rotating component, a housing, and a drive motor 25M as a drive source for rotating the propeller 25P. The regular electric power supply of the vehicle supplies electric power to the drive motor 25M.

Figure 3:
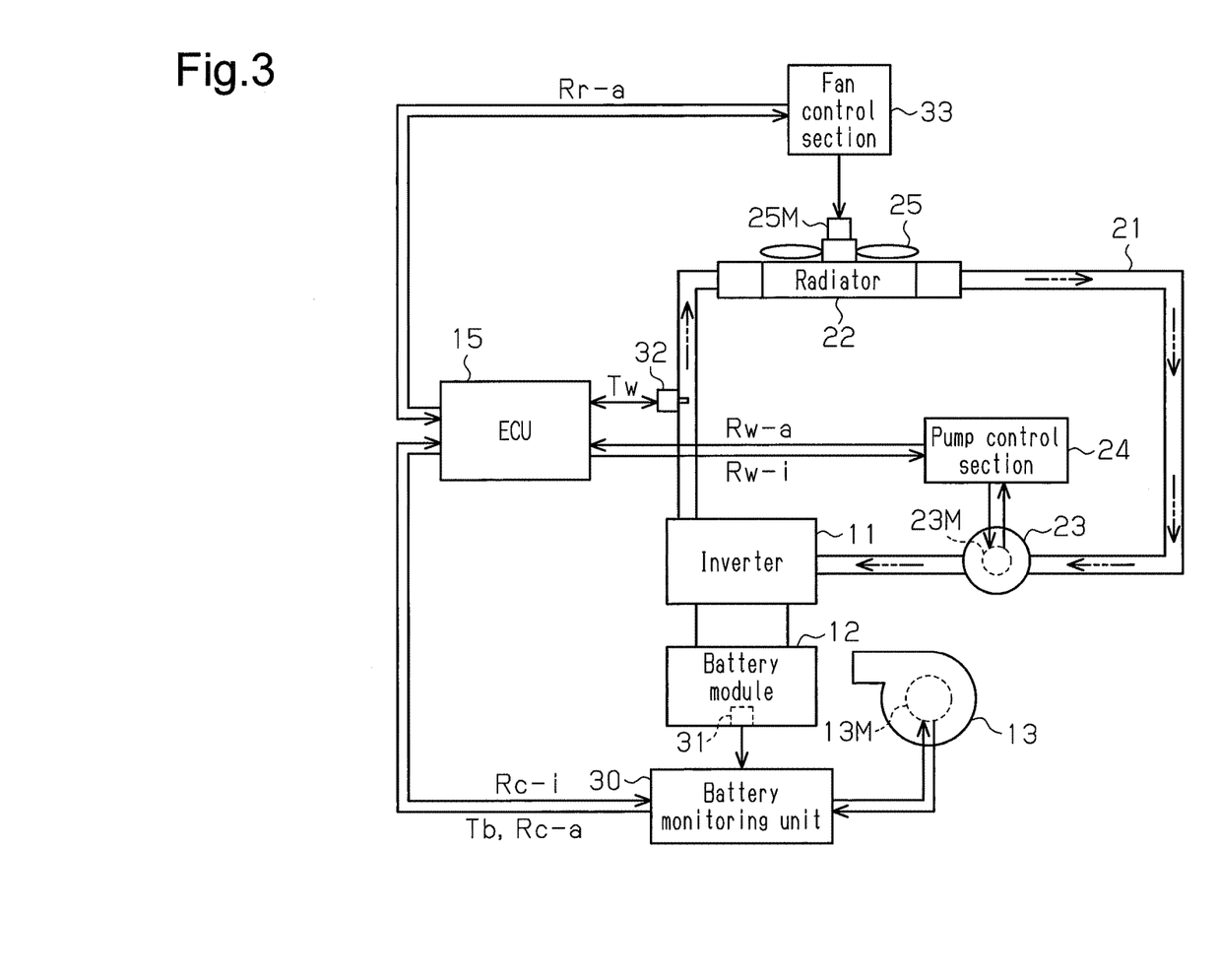
FIG. 3 is a functional block diagram showing the cooling system of FIG. 1.

The configuration and operation of the cooling system will now be described. As shown in FIG. 3, a separate battery monitoring unit 30 is arranged next to the battery module 12. The battery monitoring unit 30 monitors the state of the battery module 12, such as the remaining capacity. The battery module 12 is provided with a battery temperature sensor 31 for detecting the temperature inside the battery module 12. When receiving input of a detection signal from the battery temperature sensor 31, the battery monitoring unit 30 outputs a battery temperature Tb to the ECU 15.

When receiving input of the battery temperature Tb, the ECU 15 determines whether the battery module 12 is maintained at a temperature in an adequate temperature range. When the battery temperature Tb is in a temperature range in which cooling is required, the ECU 15 obtains an instructed rotation speed Rc-i according to the battery temperature Tb based on a map for an electric fan, which is stored in advance. The ECU 15 outputs the instructed rotation speed Rc-i to the battery monitoring unit 30. The battery monitoring unit 30 rotates the drive motor 13M of the electric fan 13 based on the instructed rotation speed Rc-i.

When the electric fan 13 rotates, a signal indicating an actual rotation speed is output from the electric fan 13. The battery monitoring unit 30 outputs an actual rotation speed Rc-a, which is based on the input signal, to the ECU 15. The ECU 15 detects an operation voltage value Vc applied to the electric fan 13.

Figure 4:
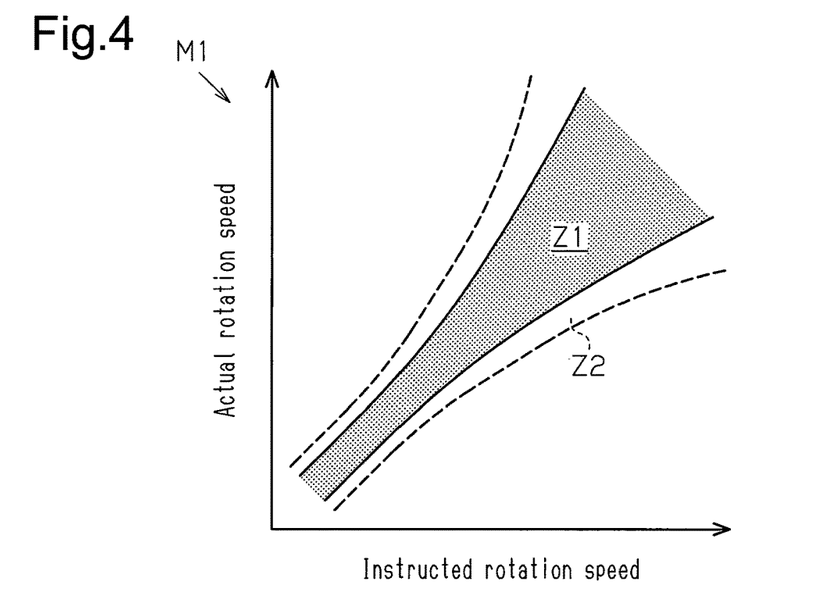
FIG. 4 is a conceptual diagram of a map used in a method for diagnosing an abnormality in the vehicle-mounted cooling system of FIG. 1.

The ECU 15 stores a diagnosis map M1 that indicates an acceptable range of an actual rotation speed of the electric fan 13 as shown in FIG. 4. The diagnosis map M1 includes an acceptable range of the actual rotation speed Rc-a according to an operation voltage value. The acceptable range is obtained through experiments, computation, and the like. The acceptable range of the actual rotation speed Rc-a varies depending on the instructed rotation speed Rc-i. For example, when the operation voltage value is 10V (volts), the acceptable range of the actual rotation speed Rc-a is represented by the area Z1 surrounded with solid lines shown in FIG. 4. The increase of the instructed rotation speed Rc-i increases the variation of the actual rotation speed Rc-a for the instructed rotation speed Rc-i. Thus, the diagnosis map M1 has a wide acceptable range of the actual rotation speed Rc-a along with the increase of the instructed rotation speed Rc-i.

The diagnosis map M1 three-dimensionally associates the instructed rotation speed Rc-i, the actual rotation speed Rc-a, and the operation voltage value Vc with one another. FIG. 4 shows a two-dimensional acceptable range with a constant operation voltage value Vc for convenience. The area Z2 surrounded with broken lines shown in FIG. 4 indicates the acceptable range of the actual rotation speed Rc-a when the operation voltage value Vc is greater than the operation voltage value Vc for the acceptable range indicated with the solid lines. The acceptable range of the area Z2 is greater than the acceptable range of the area Z1 surrounded with the solid lines. In other words, the increase of the operation voltage value Vc increases the acceptable range of the actual rotation speed Rc-a for the instructed rotation speed Rc-i.

The ECU 15 determines whether the input actual rotation speed Rc-a is included in the acceptable range for the instructed rotation speed Rc-i based on the diagnosis map M1. When the input actual rotation speed Rc-a is not included in the acceptable range, the ECU 15 determines that an abnormality has occurred in the electric fan 13.

As shown in FIG. 3, the water pump 23 includes a pump control section 24. The pump control section 24 drives the water pump 23 and changes the rotation speed of the water pump 23 according to an instruction from the ECU 15.

A water temperature sensor 32 is arranged in a portion of the circulation path 21. The water temperature sensor 32 detects the temperature of the cooling medium and outputs a detection signal of a cooling medium temperature Tw to the ECU 15. The ECU 15 obtains the cooling medium temperature Tw based on the input detection signal. The ECU 15 also stores a map that associates the cooling medium temperature Tw with the instructed rotation speed Rw-i, at which the water pump 23 is requested to drive. The ECU 15 reads out the instructed rotation speed Rw-i associated with the input cooling medium temperature Tw from the map. The ECU 15 then drives the water pump 23 according to the instructed rotation speed Rw-i by the pump control section 24.

When the water pump 23 is driven, a signal indicating an actual rotation speed is output from the water pump 23. The pump control section 24 outputs the actual rotation speed Rw-a to the ECU 15 based on the input signal. The ECU 15 also detects an operation voltage value Vw applied to the water pump 23.

The ECU 15 stores a diagnosis map that three-dimensionally associates the instructed rotation speed Rw-i and actual rotation speed Rw-a of the water pump 23, and the operation voltage value Vw with one another in a similar way to the electric fan 13. The diagnosis map includes the acceptable range of the actual rotation speed Rw-a associated with the operation voltage value Vw of the water pump 23. The acceptable range is obtained through experiments, computation, and the like. Similar to the diagnosis map M1, the diagnosis map for the water pump 23 is set to have the wide acceptable range of the actual rotation speed Rw-a along with the increase of the instructed rotation speed Rw-i. Further, the increase of the operation voltage value Vw increases the acceptable range of the actual rotation speed Rw-a.

The ECU 15 determines whether the input actual rotation speed Rw-a is included in the acceptable range for the instructed rotation speed Rw-i based on this diagnosis map. When the input actual rotation speed Rw-a is not included in the acceptable range, the ECU 15 determines that an abnormality has occurred in the water pump 23.

The radiator 22 includes an electric fan 25 and a fan control section 33 for controlling the electric fan 25. The instructed rotation speed for the electric fan 25 is set at a constant value in the present embodiment. Thus, the fan control section 33 rotates the drive motor 25M of the electric fan 25 at a constant rotation speed according to an instruction from the ECU 15.

The ECU 15 determines whether the electric fan 25 should be rotated based on whether the cooling medium temperature Tw input by the water temperature sensor 32 is less than or equal to an upper limit temperature Tmax. When the electric fan 25 is stopped and the cooling medium temperature Tw becomes greater than the upper limit temperature Tmax, the ECU 15 outputs a start signal to the drive motor 25M. When the electric fan 25 is driven and the cooling medium temperature Tw is low, the ECU 15 outputs a stop signal to the drive motor 25M.

When driven, the electric fan 25 outputs a signal indicating the actual rotation speed. The fan control section 33 outputs an actual rotation speed Rr-a to the ECU 15 based on the input signal. The ECU 15 also detects an operation voltage value Vr of the electric fan 25.

Figure 5:
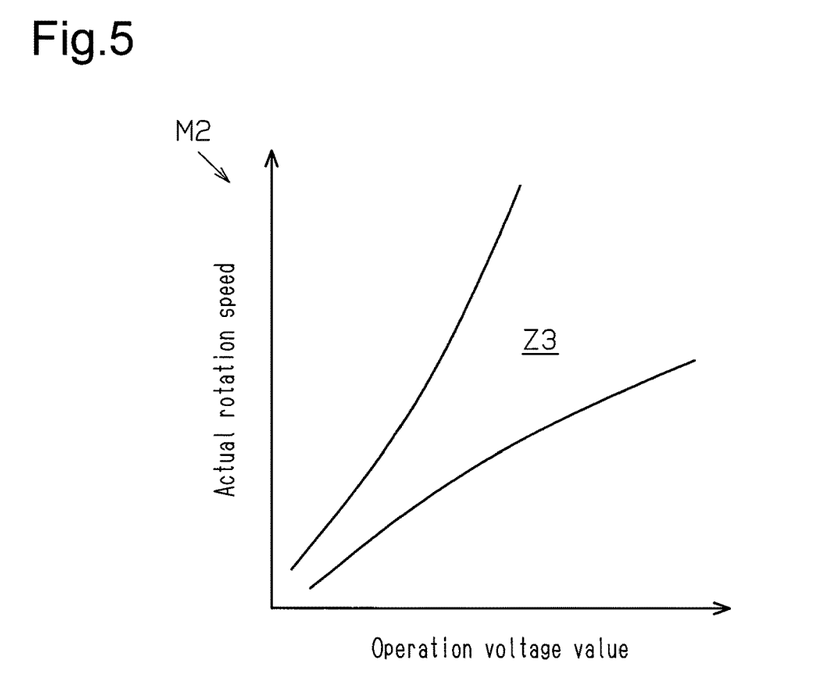
FIG. 5 is a conceptual diagram of another map used in the method for diagnosing an abnormality in the vehicle-mounted cooling system of FIG. 1.

The ECU 15 stores a diagnosis map that two-dimensionally associates the actual rotation speed Rr-a and the operation voltage value Vr of the electric fan 25 with each other. As shown in FIG. 5, the diagnosis map M2 is different from the maps for the electric fan 13 and the water pump 23 in that only the actual rotation speed Rr-a and the operation voltage value Vr are associated with each other. The diagnosis map M2 includes the acceptable range of the actual rotation speed Rr-a associated with the operation voltage value Vr of the electric fan 25. The acceptable range is obtained through experiments, computation, and the like. The diagnosis map M2 is set to have the wide acceptable range of the actual rotation speed Rr-a along with the increases of the operation voltage value Vr.

The ECU 15 determines whether the input actual rotation speed Rr-a is included in the acceptable range for the operation voltage value Vr based on the diagnosis map M2 and the operation voltage value Vr. When the input actual rotation speed Rr-a is not included in the acceptable range, the ECU 15 determines that an abnormality has occurred in the electric fan 25.

Figure 6:
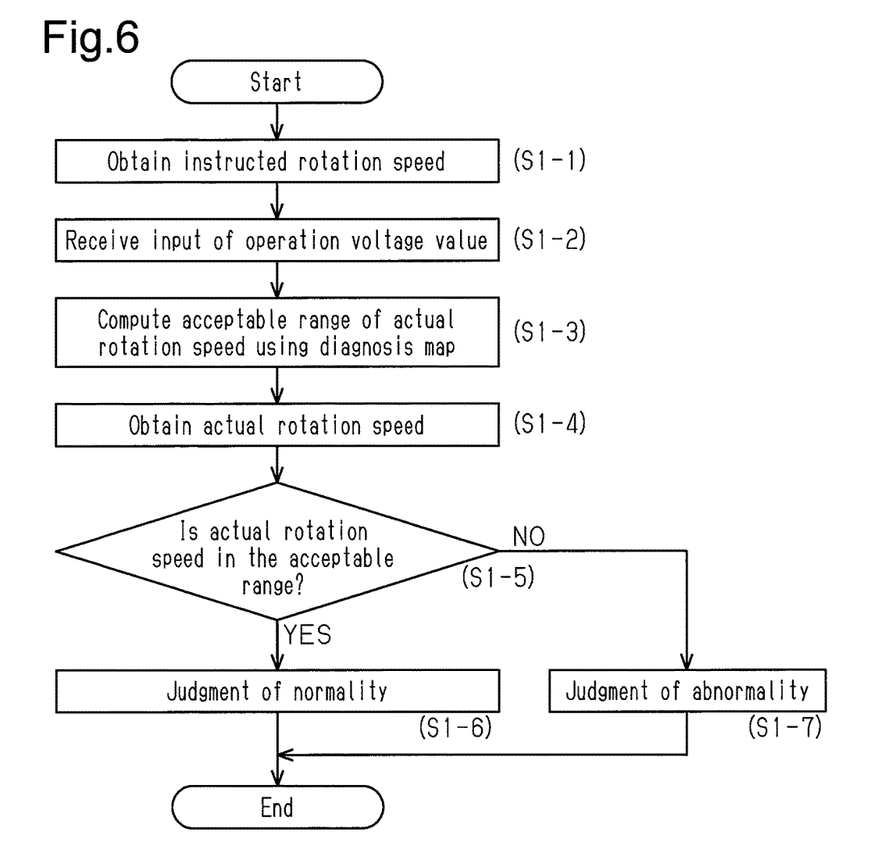
FIG. 6 is a flowchart illustrating a method for diagnosing an abnormality in the vehicle-mounted cooling system of FIG. 1 according to one embodiment.

The process of abnormality diagnosis for the electric fan 13, which is executed by the ECU 15, will now be described. The process of abnormality diagnosis starts, e.g., when an ignition switch inputs an on-signal, or when the electric fan is activated. As shown in FIG. 6, the ECU 15 obtains the instructed rotation speed Rc-i for the electric fan 13 from a built-in memory (step S1-1). The instructed rotation speed Rc-i is stored in the memory of the ECU 15 when the instructed rotation speed Rc-i is output to the electric fan 13.

The ECU 15 receives input of the operation voltage value Vc of the electric fan 13 (step S1-2). The ECU 15 also reads out the diagnosis map M1 for the electric fan 13 and computes the acceptable range of the actual rotation speed Rc-a based on the instructed rotation speed Rc-i and the operation voltage value Vc using the diagnosis map M1 (step S1-3).

The ECU 15 further obtains the actual rotation speed Rc-a of the electric fan 13 (step S1-4). In other words, the actual rotation speed Rc-a of the electric fan 13 is input to the ECU 15. The ECU 15 compares the actual rotation speed Rc-a with the computed acceptable range to determine whether the actual rotation speed Rc-a is in the acceptable range (step S1-5).

When determining that the actual rotation speed Rc-a is in the acceptable range (YES at step S1-5), the ECU 15 judges that the electric fan 13 is normal (step S1-6). When determining that the actual rotation speed Rc-a is out of the acceptable range (NO at step S1-5), the ECU 15 judges that the electric fan 13 is abnormal (step S1-7) and outputs a corresponding diagnosis code and the like to another ECU and the like. Until the abnormality diagnosis finishes, the above step S1-1 to step S1-7 are repeated.

When the electric power supply for the vehicle is in an on-state, the water pump 23 is constantly driven. Accordingly, when the state of the electric power supply turns to the on-state, abnormality diagnosis starts and continues unless the state turns to an off-state. A sequence of the abnormality diagnosis for the water pump 23 is performed by the pump control section 24. The description of the sequence of the abnormality diagnosis is omitted since it is the same as the steps of the abnormality diagnosis for the electric fan 13 except the use of the instructed rotation speed Rw-i, the actual rotation speed Rw-a, and the operation voltage value Vw of the water pump 23, and the designated diagnosis map.

Abnormality diagnosis for the electric fan 25 starts, e.g., when the ignition inputs an on-signal, or the electric fan 25 is activated. A sequence of the abnormality diagnosis for the electric fan 25 is performed by the fan control section 33. The description of the sequence of the abnormality diagnosis is omitted since it is the same as the steps of the abnormality diagnosis for the electric fan 13 except using a constant instructed rotation speed, the actual rotation speed Rr-a and the operation voltage value Vr, which are obtained from the electric fan 25, and the designated diagnosis map M2.

In this manner, the ECU 15 preforms abnormality diagnosis for each of the electric fans 13 and 25 and the water pump 23 according to the respective operation voltage values Vc, Vw, and Vr applied to the electric fans 13 and 25 and the water pump 23. This reduces diagnostic errors in the entire PCU 10 to promote a smooth drive and charge using the motor generator 2.

As described above, the above illustrated embodiment achieves the following advantages.

(1) The ECU 15 stores the diagnosis map M1 in advance. The diagnosis map M1 has an acceptable range of the actual rotation speed Rc-a of the drive motor 13M of the electric fan 13 when the actual rotation speed Rc-a is apart from the instructed rotation speed Rc-i. The acceptable range varies depending on the operation voltage value Vc applied to the drive motor 13M. The ECU 15 obtains the acceptable range of the actual rotation speed Rc-a for the instructed rotation speed Rc-i based on the operation voltage value Vc and the instructed rotation speed Rc-i of the drive motor 13M. The ECU 15 receives input of the actual rotation speed Rc-a of the drive motor 13M. When the actual rotation speed Rc-a is included in the acceptable range, the ECU 15 determines that the electric fan 13 is in a normal state. When the actual rotation speed Rc-a is out of the acceptable range, the ECU 15 determines that the electric fan 13 is in an abnormal state. Accordingly, even if the input voltage to the drive motor 13M of the electric fan 13 greatly changes, e.g., when the vehicle at idling starts moving, the acceptable range of the actual rotation speed Rc-a changes according to the voltage value. This reduces diagnostic errors, such as an erroneous diagnosis of an abnormality occurrence in the electric fan 13 when the electric fan 13 is normal.

(2) The ECU 15 stores a diagnosis map in advance. The diagnosis map has an acceptable range of the actual rotation speed Rw-a of the drive motor 23M of the water pump 23 when the actual rotation speed Rw-a is apart from the instructed rotation speed Rw-i. The acceptable range varies depending on the operation voltage value Vw applied to the drive motor 23M. The ECU 15 obtains the acceptable range of the actual rotation speed Rw-a for the instructed rotation speed Rw-i based on the operation voltage value Vw and the instructed rotation speed Rw-i of the drive motor 23M. The ECU 15 receives input of the actual rotation speed Rw-a of the drive motor 23M. When the actual rotation speed Rw-a is included in the acceptable range, the ECU 15 determines that the water pump 23 is in a normal state. When the actual rotation speed Rw-a is out of the acceptable range, the ECU 15 determines that the water pump 23 is in an abnormal state. Accordingly, even if the input voltage to the drive motor 23M of the water pump 23 greatly changes, e.g., when the vehicle at idling starts moving, the acceptable range of the actual rotation speed Rw-a changes according to the voltage value. This reduces diagnostic errors, such as an erroneous diagnosis of an abnormality occurrence in the water pump 23 when the water pump 23 is normal.

(3) The ECU 15 stores the diagnosis map M2 in advance. The diagnosis map M2 has an acceptable range of the actual rotation speed Rr-a of the drive motor 25M of the electric fan 25 when the actual rotation speed Rr-a is apart from the instructed rotation speed Rr-i. The acceptable range varies depending on the operation voltage value Vr applied to the drive motor 25M. The ECU 15 obtains the acceptable range of the actual rotation speed Rr-a for the instructed rotation speed Rr-i based on the operation voltage value Vr and the instructed rotation speed Rr-i of the drive motor 25M. The ECU 15 receives input of the actual rotation speed Rr-a of the drive motor 25M. When the actual rotation speed Rr-a is included in the acceptable range, the ECU 15 determines that the electric fan 25 is in a normal state. When the actual rotation speed Rr-a is out of the acceptable range, the ECU 15 determines that the electric fan 25 is in an abnormal state. Accordingly, even if the input voltage to the drive motor 25M of the electric fan 25 greatly changes, e.g., when the vehicle at idling starts moving, the acceptable range of the actual rotation speed Rr-a changes according to the voltage value. This reduces diagnostic errors, such as an erroneous diagnosis of an abnormality occurrence in the electric fan 25 when the electric fan 25 is normal.

The above illustrated embodiment may be modified in the following forms.

In the embodiment, the instructed rotation speed for the electric fan 25 is constant. However, the instructed rotation speed may be variable in multiple steps or continuously.

In the embodiment, the instructed rotation speeds for the electric fan 13 and the water pump 23 are variable. However, the instructed rotation speeds may be constant.

The electric fan 13 and the electric fan 25 are not limited to particular structures. For example, propeller fans, blowers, cross-flow fans, and mixed flow fans may be employed as necessary.

The water pump 23 is not limited to a particular structure. For example, plunger pumps and vane pumps may be employed.

In the embodiment, abnormality diagnosis according to an operation voltage value is performed for the electric fans 13 and 25 and the water pump 23. However, the abnormality diagnosis may be performed for at least one of the electric fans 13 and 25 and the water pump 23.

In the embodiment, the cooling system for a vehicle-mounted power control unit is installed in a hybrid vehicle. However, a cooling system according to another embodiment may be installed in an electric vehicle.

The hybrid vehicle is not limited to a particular structure. For example, the hybrid vehicle may have a structure other than a parallel type, such as structures of a series type and a power-split type.

The invention claimed is:

1. A cooling system comprising:
a cooling device for cooling a power control unit of a vehicle, wherein the cooling device includes a rotating component for delivering cooling medium and a drive source for driving the rotating component; and
an electronic control device for controlling the cooling device, wherein
the electronic control device is configured to
store drive source diagnosis reference information that indicates an actual rotation speed acceptable range, wherein an actual rotation speed acceptable range is an acceptable range of an actual rotation speed for an instructed rotation speed, and the acceptable range increases along with an increase of a voltage value applied to the drive source,
obtain the acceptable range from the voltage value applied to the drive source and the instructed rotation speed based on the drive source diagnosis reference information,
when the actual rotation speed of the drive source is included in the obtained acceptable range, determine that the cooling device is in a normal state, and
when the actual rotation speed is not included in the acceptable range, determine that the cooling device is in an abnormal state.

2. The cooling system according to claim 1, wherein
the power control unit includes an inverter connected to a rotating electrical machine and a battery connected to the inverter,
the rotating component is an electric fan that delivers air into the battery to cool the battery, and
the electronic control device is configured to
output an instructed fan rotation speed, which is an instructed rotation speed of the drive source of the electric fan, to the drive source of the electric fan according to a temperature inside the battery,
store fan diagnosis reference information that indicates a fan rotation speed acceptable range, wherein the fan rotation speed acceptable range is an acceptable range of the actual fan rotation speed, which is an actual rotation speed of the drive source of the electric fan, and the fan rotation speed acceptable range increases along with an increase of the voltage value applied to the electric fan,
obtain the fan rotation speed acceptable range from the voltage value applied to the drive source of the electric fan and the instructed fan rotation speed based on the fan diagnosis reference information,
when the actual fan rotation speed is included in the obtained fan rotation speed acceptable range, determine that the electric fan is in a normal state, and
when the actual fan rotation speed is not included in the fan rotation speed acceptable range, determine that the electric fan is in an abnormal state.

3. The cooling system according to claim 2, wherein, in the fan diagnosis reference information, the fan rotation speed acceptable range increases along with an increase of the instructed fan rotation speed.

4. The cooling system according to claim 1, wherein
the power control unit includes an inverter connected to a rotating electrical machine and a battery connected to the inverter,
the cooling device further includes a cooling medium circulation flow path, through which cooling medium circulates, and a radiator for cooling the cooling medium,
the cooling medium cools at least the inverter,
the rotating component is a pump that delivers the cooling medium, and
the electronic control device is configured to output an instructed pump rotation speed, which is an instructed rotation speed of the drive source of the pump, to the pump according to a temperature of the cooling medium, store a pump rotation speed acceptable range that is an actual pump rotation speed acceptable range, wherein the actual pump rotation speed acceptable range is an acceptable range of the actual pump rotation speed, which is an actual rotation speed of the drive source of the pump, and the pump rotation speed acceptable range increases along with an increase of the voltage value applied to the drive source, obtain the pump rotation speed acceptable range from the voltage value applied to the drive source and the instructed pump rotation speed based on the drive source diagnosis reference information, when the actual pump rotation speed is included in the obtained pump rotation speed acceptable range, determine that the pump is in a normal state, and when the actual pump rotation speed is not included in the pump rotation speed acceptable range, determine that the pump is in an abnormal state.

5. The cooling system according to claim 4, wherein, in the drive source diagnosis reference information, the pump rotation speed acceptable range increases along with an increase of the instructed pump rotation speed.

6. The cooling system according to claim 1, wherein the power control unit includes an inverter connected to a rotating electrical machine and a battery connected to the inverter, the cooling device further includes a cooling medium circulation path, through which cooling medium circulates, and a radiator for cooling the cooling medium, the cooling medium cools at least the inverter, the rotating component is an electric fan that delivers air to cool the radiator, and the electronic control device is configured to store fan diagnosis reference information that indicates a fan rotation speed acceptable range, wherein the fan rotation speed acceptable range is an acceptable range of the actual fan rotation speed, which is an actual rotation speed of the drive source of the electric fan, and the fan rotation speed acceptable range increases along with an increase of the voltage value applied to the drive source, obtain the fan rotation speed acceptable range from the voltage value applied to the drive source based on the drive source diagnosis reference information, when the actual fan rotation speed is included in the obtained fan rotation speed acceptable range, determine that the electric fan is in a normal state and when the actual fan rotation speed is not included in the fan rotation speed acceptable range, determine that the electric fan is in an abnormal state.

7. A method for diagnosing an abnormality in a cooling device for cooling a power control unit of a vehicle, wherein the cooling device includes a rotating component for delivering cooling medium and a drive source for driving the rotating component, the method comprising:

setting and storing drive source diagnosis reference information in advance, wherein the drive source diagnosis reference information indicates an actual rotation speed acceptable range, wherein the actual rotation speed acceptable range is an acceptable range of an actual rotation speed for an instructed rotation speed, and the acceptable range increases along with an increase of a voltage value applied to the drive source;

obtaining the acceptable range from the voltage value applied to the drive source and the instructed rotation speed based on the drive source diagnosis reference information;

when the actual rotation speed of the drive source is included in the obtained acceptable range, determining that the cooling device is in a normal state; and when the actual rotation speed is not included in the acceptable range, determining that the cooling device is in an abnormal state.

* * * * *